United States Patent
Yen et al.

(10) Patent No.: US 10,748,767 B2
(45) Date of Patent: Aug. 18, 2020

(54) METHOD FOR FORMING CONDUCTIVE LINES

(71) Applicant: Taiwan Semiconductor Manufacturing Co., Ltd., Hsin-Chu (TW)

(72) Inventors: Yung-Sung Yen, New Taipei (TW); Ken-Hsien Hsieh, Taipei (TW); Ru-Gun Liu, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 14 days.

(21) Appl. No.: 16/229,144

(22) Filed: Dec. 21, 2018

(65) Prior Publication Data

US 2019/0122887 A1    Apr. 25, 2019

Related U.S. Application Data

(63) Continuation of application No. 15/593,214, filed on May 11, 2017, now Pat. No. 10,163,634.

(60) Provisional application No. 62/339,484, filed on May 20, 2016.

(51) Int. Cl.
| | |
|---|---|
| *H01L 21/00* | (2006.01) |
| *H01L 21/033* | (2006.01) |
| *H01L 21/768* | (2006.01) |
| *H01L 23/528* | (2006.01) |
| *H01L 21/027* | (2006.01) |
| *H01L 21/311* | (2006.01) |

(52) U.S. Cl.
CPC ...... *H01L 21/0337* (2013.01); *H01L 21/0273* (2013.01); *H01L 21/0332* (2013.01); *H01L 21/31144* (2013.01); *H01L 21/76802* (2013.01); *H01L 21/76816* (2013.01); *H01L 23/528* (2013.01); *H01L 23/5283* (2013.01)

(58) Field of Classification Search
CPC ............ H01L 21/0337; H01L 23/5283; H01L 21/76816; H01L 21/76802
See application file for complete search history.

(56) References Cited

U.S. PATENT DOCUMENTS

| | | | |
|---|---|---|---|
| 6,015,751 A * | 1/2000 | Liu | .................... H01L 21/76802 |
| | | | 257/E21.577 |
| 6,914,316 B2 | 7/2005 | Yun et al. | |
| 7,968,421 B2 | 6/2011 | Shin | |

(Continued)

*Primary Examiner* — Laura M Menz
(74) *Attorney, Agent, or Firm* — Haynes and Boone, LLP

(57) ABSTRACT

Various patterning methods involved with manufacturing semiconductor device structures are disclosed herein. A method for forming a semiconductor device structure (for example, a conductive line) includes forming a first hard mask layer and a second hard mask layer over a dielectric layer. The first hard mask layer has a first opening, and the second hard mask layer has a first trench connected to the first opening. A filling layer is formed in the first opening, where the filling layer has a second opening and a third opening. The first hard mask layer and the dielectric layer are removed through the second opening and the third opening to form a second trench and a third trench in the dielectric layer. The first hard mask layer, the second hard mask layer, and the filling layer can be removed. A conductive layer is formed in the second trench and the third trench.

8 Claims, 17 Drawing Sheets

(56) References Cited

U.S. PATENT DOCUMENTS

| | | |
|---|---|---|
| 8,669,180 B1 | 3/2014 | Lee et al. |
| 8,697,537 B2 | 4/2014 | Lee et al. |
| 8,962,432 B2 | 2/2015 | Lee et al. |
| 9,054,164 B1 * | 6/2015 | Jezewski ............ H01L 21/76879 |
| 9,406,511 B2 | 8/2016 | Huang et al. |
| 9,601,348 B2 * | 3/2017 | Chu .................... H01L 23/5226 |
| 10,000,373 B2 * | 6/2018 | Chen .................... B81B 3/0021 |
| 10,163,633 B2 * | 12/2018 | Law .................... H01L 21/0276 |
| 2004/0032006 A1 | 2/2004 | Yun et al. |
| 2007/0173007 A1 * | 7/2007 | Lee .................... H01L 27/1203 |
| | | 438/209 |
| 2009/0186463 A1 | 7/2009 | Shin |
| 2012/0100717 A1 | 4/2012 | Lii et al. |
| 2013/0187237 A1 | 7/2013 | Yu et al. |
| 2015/0108652 A1 * | 4/2015 | Hong ................ H01L 21/76807 |
| | | 257/773 |
| 2015/0155198 A1 * | 6/2015 | Tsai .................... H01L 21/0332 |
| | | 438/674 |
| 2017/0210613 A1 * | 7/2017 | Chen .................... B81C 1/00246 |
| 2017/0338115 A1 * | 11/2017 | Yen .................... H01L 21/76802 |
| 2018/0240699 A1 * | 8/2018 | Chan ................ H01L 21/76816 |
| 2018/0261457 A1 * | 9/2018 | Law .................. H01L 21/76816 |
| 2018/0334383 A1 * | 11/2018 | Chen .................... B81C 1/00246 |
| 2019/0088535 A1 * | 3/2019 | Yan .................... H01L 23/5226 |
| 2019/0122887 A1 * | 4/2019 | Yen .................... H01L 21/31144 |

\* cited by examiner

METHOD FOR FORMING CONDUCTIVE LINES

This is a continuation application of U.S. patent application Ser. No. 15/593,214, filed May 11, 2017, now U.S. Pat. No. 10,163,634, which is a non-provisional and claims benefit of U.S. Provisional Patent Application Ser. No. 62/339,484, filed May 20, 2016, both of which are hereby incorporated by reference in their entirety.

BACKGROUND

The semiconductor integrated circuit (IC) industry has experienced rapid growth. Technological advances in IC materials and design have produced generations of ICs. Each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. However, these advances have increased the complexity of processing and manufacturing ICs. For example, as feature sizes continue to decrease, fabrication processes continue to become more difficult to perform. Therefore, challenges arise to forming reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-2 to 1H-2 are cross-sectional views of various stages of a process for forming a semiconductor device structure along lines A-A' shown in FIGS. 1A-1 to 1H-1 according to various aspects of the present disclosure.

FIGS. 1A-3 to 1H-3 are cross-sectional views of various stages of a process for forming a semiconductor device structure along lines B-B' shown in FIGS. 1A-1 to 1H-1 according to various aspects of the present disclosure.

FIGS. 1E-4 to 1H-4 are cross-sectional views of various stages of a process for forming a semiconductor device structure along lines C-C' shown in FIGS. 1E-1 to 1H-1 according to various aspects of the present disclosure.

FIGS. 2A-1 to 2G-1 are top views of various stages of a process for forming a semiconductor device structure, in accordance with some embodiments.

FIGS. 2A-2 to 2G-2 are cross-sectional views of various stages of a process for forming a semiconductor device structure along lines A-A' shown in FIGS. 2A-1 to 2G-1, in accordance with some embodiments.

DETAILED DESCRIPTION

Figures 1, 1A:
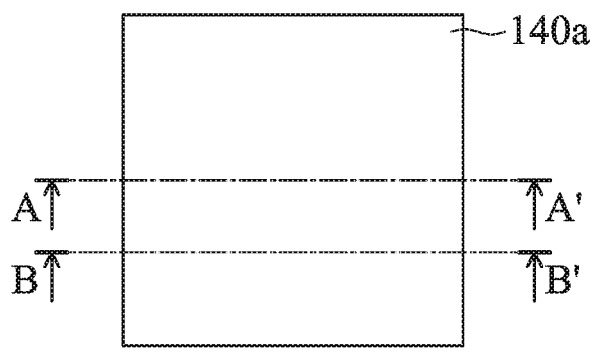
FIGS. 1A-1 to 1H-1 are top views of various stages of a process for forming a semiconductor device structure according to various aspects of the present disclosure.

The present application relates to semiconductor devices and methods for manufacturing semiconductor devices, and more particularly, to patterning methods involved with manufacturing semiconductor device structures (for example, conductive lines).

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Figures 1, 1A, 2:
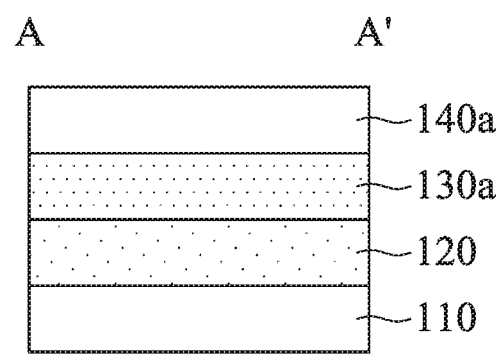
Figures 1, 1A, 2, 3:
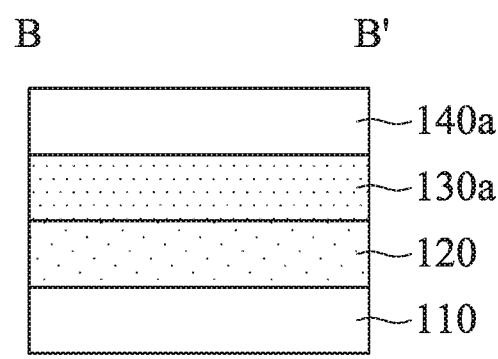
Figures 1, 1B:
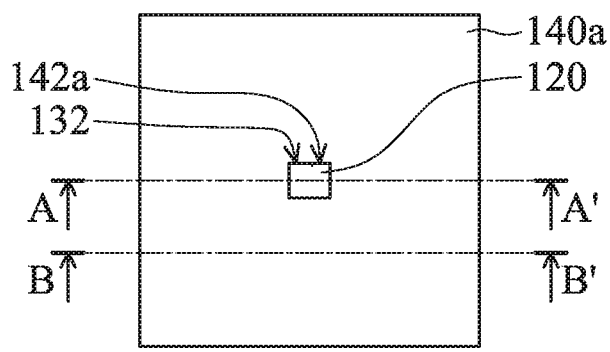
Figures 1, 1B, 2:
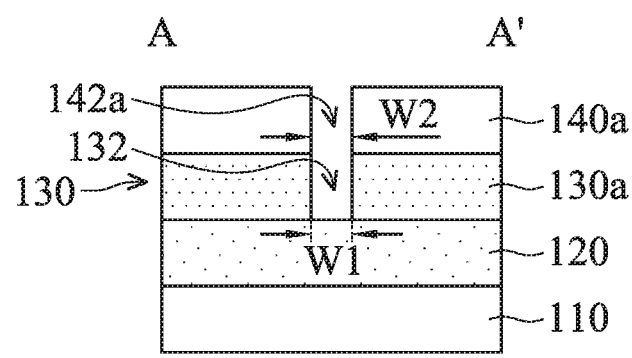
Figures 1, 1B, 2, 3:
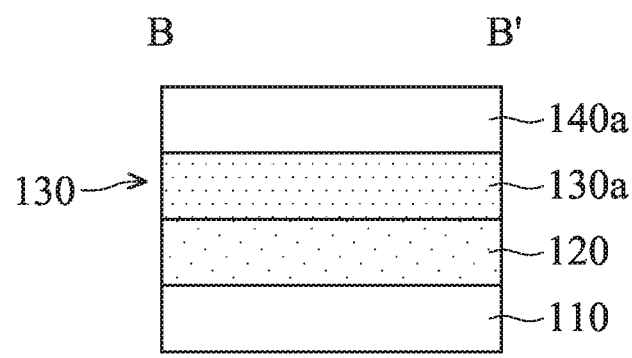
Figures 1, 1C:
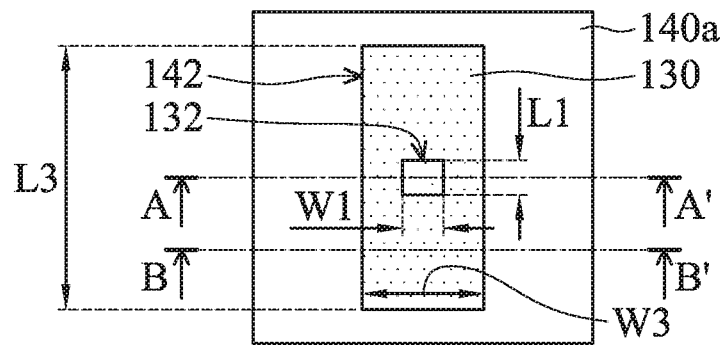
Figures 1, 1C, 2:
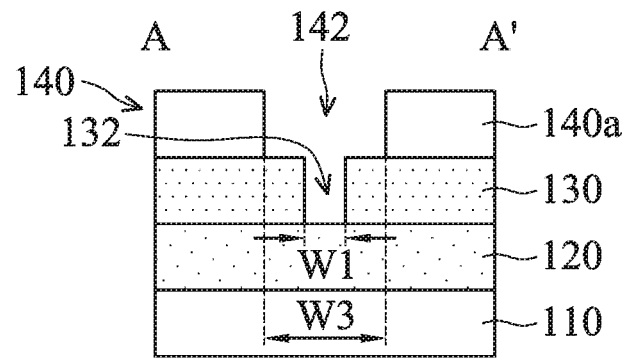
Figures 1, 1C, 2, 3:
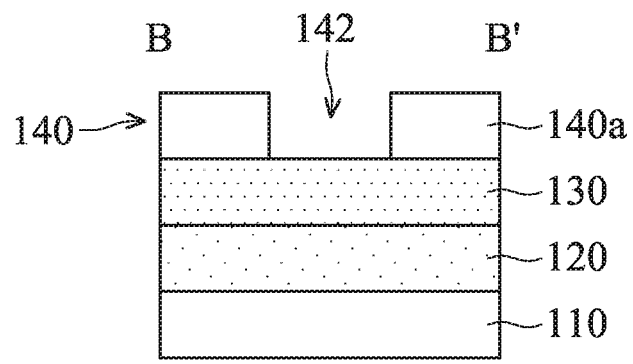
Figures 1, 1D:
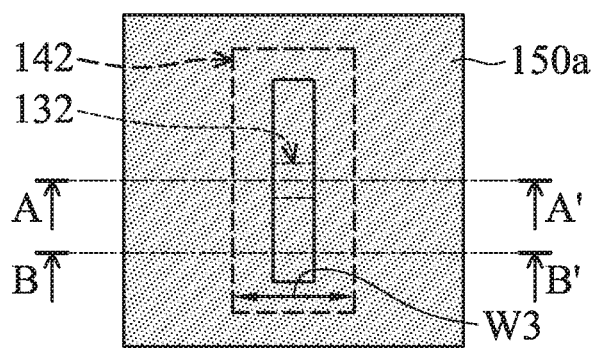
Figures 1, 1D, 2:
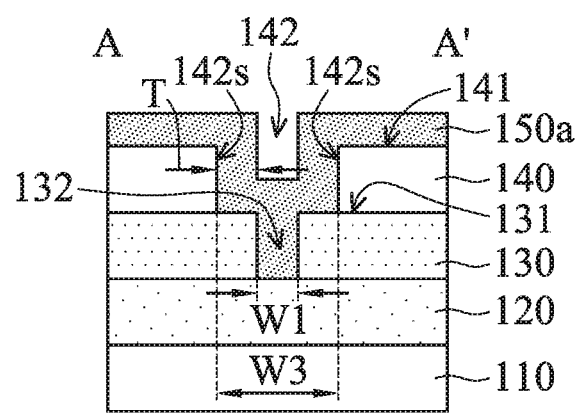
Figures 1, 1D, 2, 3:
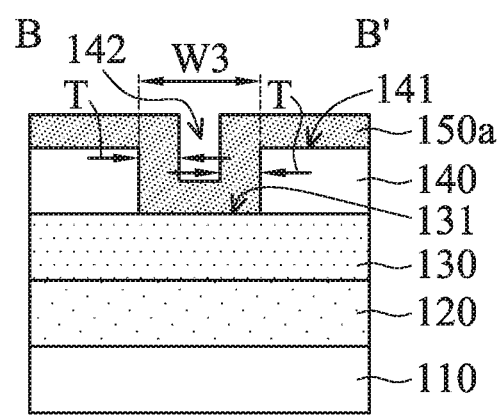
Figures 1, 1E:
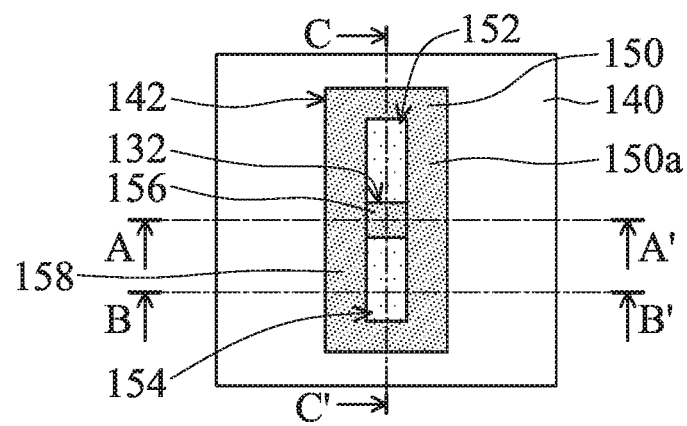
Figures 1, 1E, 2:
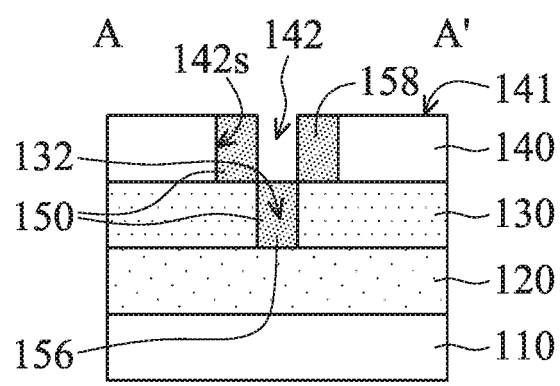
Figures 1, 1E, 2, 3:
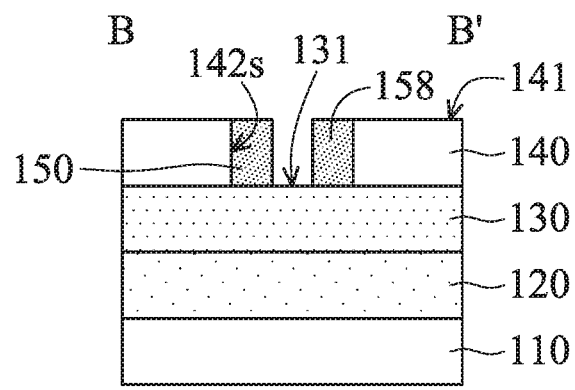
Figures 1, 1E, 2, 3, 4:
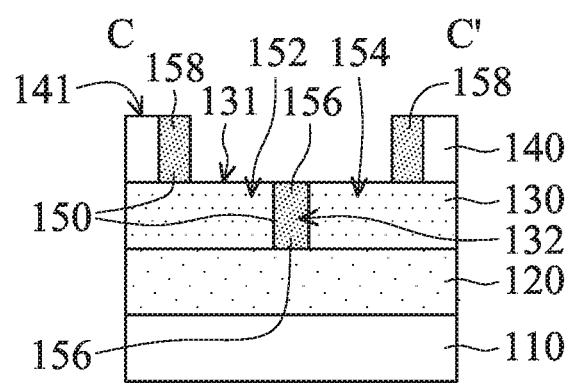
Figures 1, 1F:
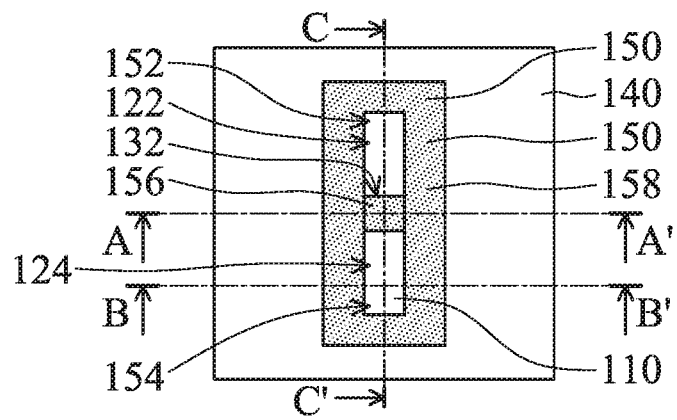
Figures 1, 1F, 2:
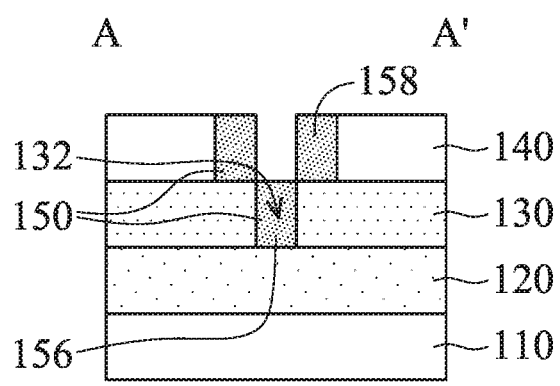
Figures 1, 1F, 2, 3:
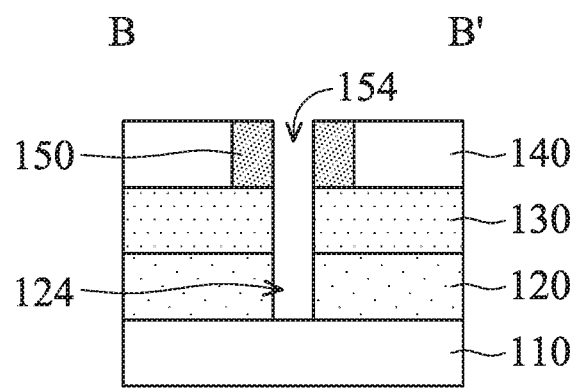
Figures 1, 1F, 2, 3, 4:
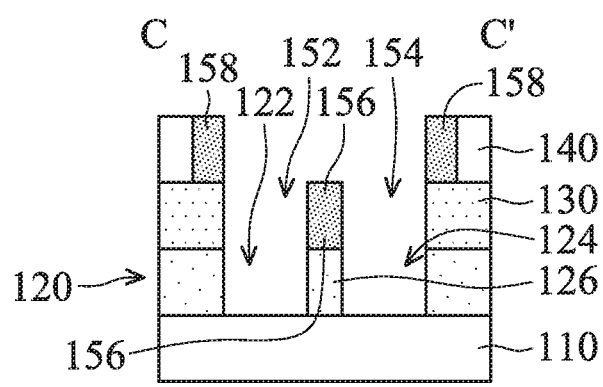
Figures 1, 1G:
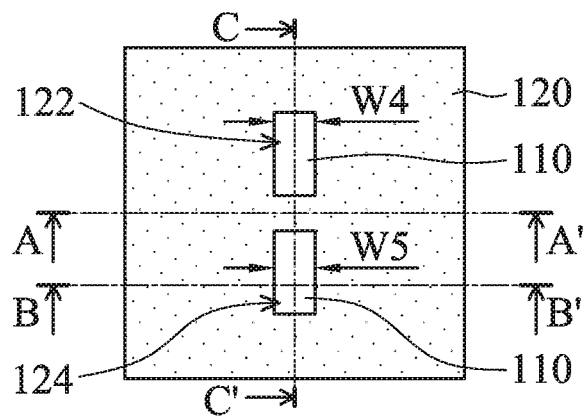
Figures 1, 1G, 2:
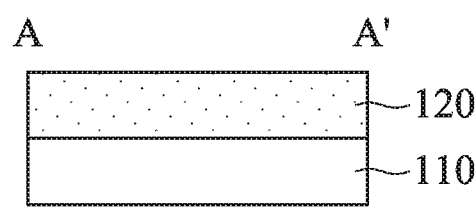
Figures 1, 1G, 2, 3:
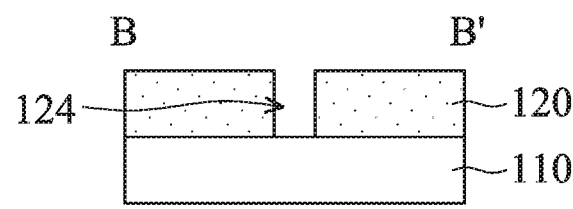
Figures 1, 1G, 2, 3, 4:
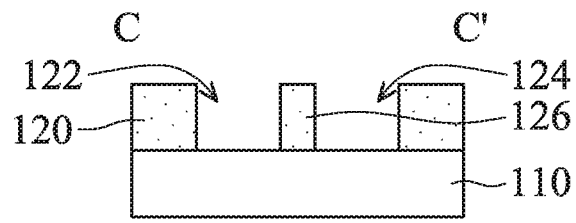
Figures 1, 1H:
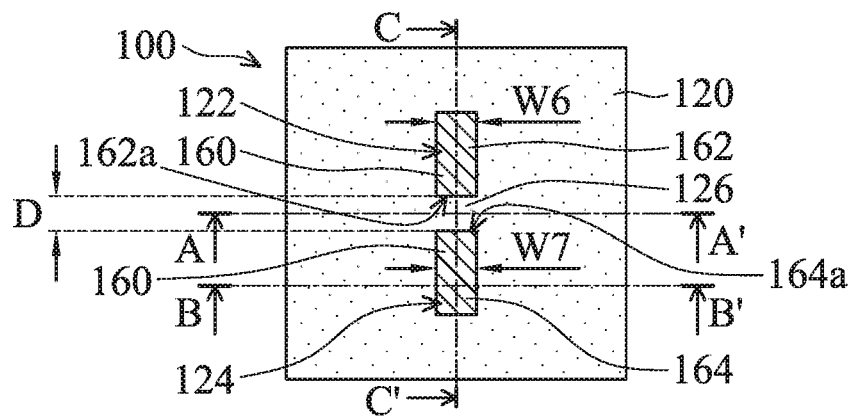
Figures 1, 1H, 2:
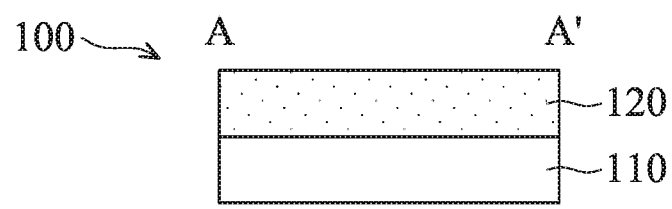
Figures 1, 1H, 2, 3:
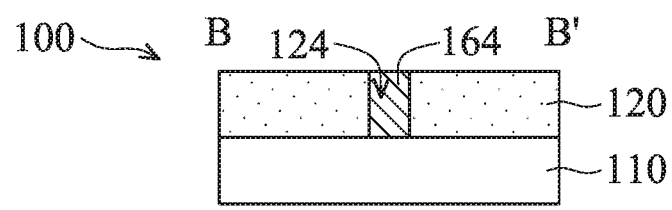
Figures 1, 1H, 2, 3, 4:
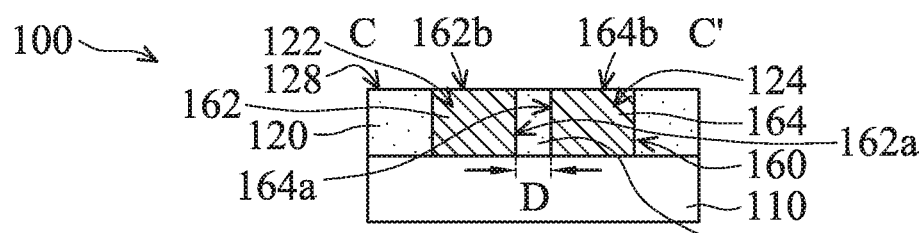

FIGS. 1A-1 to 1H-1 are top views of various stages of a process for forming a semiconductor device structure 100 according to various aspects of the present disclosure. FIGS. 1A-2 to 1H-2 are cross-sectional views of various stages of a process for forming the semiconductor device structure 100 along lines A-A' shown in FIGS. 1A-1 to 1H-1, according to various aspects of the present disclosure. FIGS. 1A-3 to 1H-3 are cross-sectional views of various stages of a process for forming the semiconductor device structure 100 along lines B-B' shown in FIGS. 1A-1 to 1H-1, according to various aspects of the present disclosure. FIGS. 1E-4 to 1H-4 are cross-sectional views of various stages of a process for forming the semiconductor device structure 100 along lines C-C' shown in FIGS. 1E-1 to 1H-1, according to various aspects of the present disclosure. Additional features can be added in the semiconductor device structure 100, and some of the features described below can be replaced, modified, or eliminated in other embodiments of the semiconductor device structure 100.

In FIGS. 1A-1, 1A-2, and 1A-3, a substrate 110 is provided, in accordance with some embodiments. The substrate 110 may be a semiconductor wafer, such as a silicon wafer. Alternatively or additionally, the substrate 110 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

The substrate 110 may further include a device region. The device region may have various device elements. Examples of device elements may include, but are not limited to, transistors, diodes, and/or other applicable elements. Examples of the transistors may include, but are not limited to, metal oxide semiconductor field effect transistors (MOSFETs), complementary metal oxide semiconductor (CMOS) transistors, bipolar junction transistors (BJTs), high voltage transistors, high frequency transistors, p-channel and/or n-channel field effect transistors (PFETs/NFETs), or the like. Various processes are performed to form the device elements, such as deposition, etching, implantation, photolithography, annealing, and/or other applicable processes. In some embodiments, the device region is formed in the substrate 110 in a back-end-of-line (BEOL) process.

In FIG. 1A-2 and FIG. 1A-3, a dielectric layer 120 is formed over the substrate 110, in accordance with some embodiments. The dielectric layer 120 is an inter-metal dielectric (IMD) layer, in accordance with some embodiments. The dielectric layer 120 may include multilayers made of multiple dielectric materials, such as a low dielectric constant or an extreme low dielectric constant (ELK) material. Examples of the dielectric materials may include, but are not limited to, oxide (such as $SiO_2$), borophosphosilicate glass (BPSG), tetraethyl orthosilicate (TEOS), spin on glass (SOG), undoped silicate glass (USG), fluorinated silicate glass (FSG), high-density plasma (HDP) oxide, or plasma-enhanced TEOS (PETEOS). The dielectric layer 120 may be formed by chemical vapor deposition (CVD), physical vapor deposition (PVD), atomic layer deposition (ALD), spin-on coating, or another applicable process.

In FIG. 1A-2 and FIG. 1A-3, a first hard mask material layer 130a is formed over the dielectric layer 120, in accordance with some embodiments. Examples of a material for the first hard mask material layer 130a include, but are not limited to, silicon nitride, silicon carbide, silicon oxide, silicon oxynitride, polymeric carbon, graphitic carbon, titanium oxide, silicon, another suitable material, or a combination thereof. In some embodiments, the first hard mask material layer 130a includes multiple stacked layers. The multiple stacked layers may be made of the same material. Alternatively, some of the stacked layers are made of different materials. The first hard mask material layer 130a may be formed by CVD, PVD, ALD, spin-on coating, or another applicable process.

In FIG. 1A-1, FIG. 1A-2, and FIG. 1A-3, a second hard mask material layer 140a is formed over the first hard mask material layer 130a, in accordance with some embodiments. Examples of a material for the second hard mask material layer 140a include, but are not limited to, silicon nitride, silicon carbide, silicon oxide, silicon oxynitride, polymeric carbon, graphitic carbon, titanium oxide, silicon, another suitable material, or a combination thereof. In some embodiments, the second hard mask material layer 140a includes multiple stacked layers. The multiple stacked layers may be made of the same material. Alternatively, some of the stacked layers are made of different materials. The second hard mask material layer 140a may be formed by CVD, PVD, ALD, spin-on coating, or another applicable process. In some embodiments, the first hard mask material layer 130a, the second hard mask material layer 140a, and the dielectric layer 120 are made of different materials, such that the first hard mask material layer 130a, the second hard mask material layer 140a, and the dielectric layer 120 can have etching selectivity in subsequent etching processes.

In FIG. 1B-1, FIG. 1B-2, and FIG. 1B-3, a portion of the first hard mask material layer 130a and the second hard mask material layer 140a is removed to form an opening 132 in the first hard mask material layer 130a and an opening 142a in the second hard mask material layer 140a, in accordance with some embodiments. The opening 132 is connected to the opening 142a so as to expose a portion of the dielectric layer 120, in accordance with some embodiments. The first hard mask material layer 130a with the opening 132 forms a first hard mask layer 130, in accordance with some embodiments. In some embodiments, the opening 132 has a width W1, and the opening 142a has a width W2 substantially equal to the width W1. In some embodiments, the width W1 ranges from about 1 nm to about 40 nm. In some embodiments, the width W2 ranges from about 1 nm to about 40 nm. In some embodiments, the removal of the portion of the first hard mask material layer 130a and the second hard mask material layer 140a includes forming a photoresist layer (not shown) with an opening over the second hard mask material layer 140a and etching the second hard mask material layer 140a and the first hard mask material layer 130a through the opening of the photoresist layer. The etching process includes a dry etching process, in accordance with some embodiments.

In FIG. 1C-1, FIG. 1C-2, and FIG. 1C-3, a portion of the second hard mask material layer 140a surrounding the opening 142a is removed to form a trench 142 in the second hard mask material layer 140a, in accordance with some embodiments. The trench 142 connects to the opening 132, in accordance with some embodiments. The second hard mask material layer 140a with the trench 142 forms a second hard mask layer 140, in accordance with some embodiments. The trench 142 has a width W3 and a length L3, in accordance with some embodiments. In some embodiments, the width W3 of the trench 142 is greater than the width W1 of the opening 132. In some embodiments, the length L3 of the trench 142 is greater than a length L1 of the opening 132. In some embodiments, the opening 132 is positioned under a center portion of the trench 142 in a width direction of the trench 142. In some embodiments, the opening 132 is positioned under a center portion of the trench 142 in a width direction and a length direction of the trench 142. In some embodiments, the width W3 ranges from about 20 nm to about 100 nm. In some embodiments, the formation of the trench 142 includes forming a photoresist layer (not shown) with an opening over the second hard mask material layer 140a and etching the second hard mask material layer 140a through the opening of the photoresist layer. The etching process includes a dry etching process, in accordance with some embodiments.

In FIG. 1D-1, FIG. 1D-2, and FIG. 1D-3, a filling material layer 150a is formed over the first hard mask layer 130, the second hard mask layer 140, and the dielectric layer 120 exposed by the opening 132, in accordance with some embodiments. In some embodiments, the filling material layer 150a conformally covers a top surface 131 of the first hard mask layer 130, a top surface 141 of the second hard mask layer 140, and inner walls 142s of the trench 142. The filling material layer 150a includes a dielectric material, in accordance with some embodiments. The dielectric material includes silicon nitride, silicon oxynitride, or combinations thereof, in accordance with some embodiments. In some embodiments, the filling material layer 150a, the first hard mask layer 130, and the dielectric layer 120 are made of different materials, such that the filling material layer 150a, the first hard mask layer 130, and the dielectric layer 120 can have etching selectivity in subsequent etching processes.

The formation of the filling material layer 150a includes a chemical vapor deposition process, a physical vapor deposition process, or another suitable deposition process.

The filling material layer 150a has a thickness T, in accordance with some embodiments. The width W1 of the opening 132 is less than two times the thickness T of the filling material layer 150a, in accordance with some embodiments. Therefore, the filling material layer 150a fills the opening 132, in accordance with some embodiments. The width W3 of the trench 142 is greater than two times the thickness T of the filling material layer 150a, in accordance with some embodiments. Therefore, the filling material layer 150a does not fill up the entire trench 142, in accordance with some embodiments. The difference between the width W3 of the trench 142 and two times the thickness T of the filling material layer 150a defines line widths of conductive lines formed subsequently.

In FIG. 1E-1, FIG. 1E-2, FIG. 1E-3, and FIG. 1E-4, a portion of the filling material layer 150a is removed to form an opening 152 and an opening 154 exposing the first hard mask layer 130, in accordance with some embodiments. The opening 152 and the opening 154 are positioned at the two opposite sides of the opening 132, respectively, in accordance with some embodiments. The portion of the filling material layer 150a is removed by using an anisotropic etching process, in accordance with some embodiments. The anisotropic etching process includes a dry etching process, in accordance with some embodiments. In some embodiments, the removal of the portion of the filling material layer 150a includes removing a portion of the filling material layer 150a over the top surface 131 of the first hard mask layer 130. In some embodiments, the removal of the portion of the filling material layer 150a further includes removing the filling material layer 150a over the top surface 141 of the second hard mask layer 140. In some embodiments, the removal of the portion of the filling material layer 150a further includes removing the filling material layer 150a over the opening 132.

The filling material layer 150a within the opening 152 and the opening 154 forms a filling layer 150, in accordance with some embodiments. The filling layer 150 has a first portion 156 and a second portion 158, in accordance with some embodiments. The first portion 156 is filled in the opening 132, and the second portion 158 is positioned over the inner walls 142s of the trench 142, in accordance with some embodiments. The opening 152 and the opening 154 are separated from each other by the first portion 156, in accordance with some embodiments. In some embodiments, the first portion 156 is connected to the second portion 158.

In FIG. 1F-1, FIG. 1F-2, FIG. 1F-3, and FIG. 1F-4, the first hard mask layer 130 and the dielectric layer 120 are removed through the opening 152 and the opening 154 to form a trench 122 and a trench 124 in the dielectric layer 120, in accordance with some embodiments. The trench 122 is positioned under the opening 152, in accordance with some embodiments. The trench 124 is positioned under the opening 154, in accordance with some embodiments. After the removal process, a portion 126 of the dielectric layer 120 under the first portion 156 of the filling layer 150 remains and separates the trench 122 from the trench 124, in accordance with some embodiments. The first hard mask layer 130 and the dielectric layer 120 are removed by using an anisotropic etching process, in accordance with some embodiments. The anisotropic etching process includes a dry etching process, in accordance with some embodiments.

In FIG. 1G-1, FIG. 1G-2, FIG. 1G-3, and FIG. 1G-4, the first hard mask layer 130, the second hard mask layer 140, and the filling layer 150 are removed, in accordance with some embodiments. In some embodiments, the first hard mask layer 130, the second hard mask layer 140, and the filling layer 150 are removed by using a dry etching process or a wet etching process. The trench 122 has a width W4, and the trench 124 has a width W5, in accordance with some embodiments. In some embodiments, the width W4 is substantially equal to the width W5. In some embodiments (not shown), the width W4 is different from the width W5. The width W4 ranges from about 1 nm to about 20 nm, in accordance with some embodiments. The width W5 ranges from about 1 nm to about 20 nm, in accordance with some embodiments.

In FIG. 1H-1, FIG. 1H-2, FIG. 1H-3, and FIG. 1H-4, a conductive layer 160 is formed in the trench 122 and the trench 124 of the dielectric layer 120, in accordance with some embodiments. In some embodiments, the formation of the conductive layer 160 includes depositing a conductive material layer (not shown) over the dielectric layer 120 to fill the trenches 122 and 124 and removing the conductive material layer outside of the trenches 122 and 124. The conductive material layer outside of the trenches 122 and 124 is removed by using a chemical mechanical polishing (CMP) process, in accordance with some embodiments. The conductive layer 160 positioned in the trench 122 forms a conductive line 162, in accordance with some embodiments. The conductive layer 160 positioned in the trench 124 forms a conductive line 164, in accordance with some embodiments. The conductive lines 162 and 164 are arranged end-to-end and spaced apart from each other, in accordance with some embodiments. The portion 126 of the dielectric layer 120 separates the conductive lines 162 and 164 from each other, in accordance with some embodiments. In some embodiments, the conductive lines 162 and 164 are arranged in a straight line.

The conductive line 162 has a width W6, and the conductive line 164 has a width W7, in accordance with some embodiments. In some embodiments, the width W6 is substantially equal to the width W7. In some embodiments (not shown), the width W6 is different from the width W7. The width W6 ranges from about 1 nm to about 20 nm, in accordance with some embodiments. The width W7 ranges from about 1 nm to about 20 nm, in accordance with some embodiments. In some embodiments, a distance D between an end 162a of the conductive line 162 and an end 164a of the conductive line 164 ranges from about 1 nm to about 80 nm. The distance D is also referred to as an end-to-end spacing, in accordance with some embodiments. A top surface 128 of the dielectric layer 120, a top surface of 162b of the conductive line 162, and a top surface 164b of the conductive line 164 are substantially aligned with each other, in accordance with some embodiments.

It should be noted that the method of the present embodiments uses the first hard mask layer 130 with the opening 132, the second hard mask layer 140 with the trench 142, and the filling layer 150 filled in the opening 132 as an etching mask to form the trenches 122 and 124 for forming the conductive lines 162 and 164. Therefore, the filling layer 150 filled in the opening 132 enables the portion 126 of the dielectric layer 120 to remain and separate the conductive lines 162 and 164 from each other. As a result, the portion 126 of the dielectric layer 120 may prevent the conductive lines 162 and 164 from being short-circuited with each other. Therefore, the method of the present embodiments may form the conductive lines 162 and 164 arranged end-to-end and spaced apart from each other. The end-to-end arrangement may improve the arrangement density of conductive lines and routing flexibility.

The conductive lines 162 and 164 are configured to electrically connect the device elements formed in (and/or over) the substrate 110, in accordance with some embodiments. The conductive lines 162 and 164 include a highly-conductive metal, a low-resistive metal, an elemental metal, a transition metal, or the like, in accordance with some embodiments. The conductive lines 162 and 164 include, for example, copper (Cu), aluminum (Al), tungsten (W), titanium (Ti), gold (Au), or tantalum (Ta). In addition, the conductive lines 162 and 164 may further include a liner and/or a barrier layer. For example, a liner (not shown) may be formed in the trench 122 and the trench 124, where the liner covers the sidewalls and bottom of the trench 122 and the trench 124. The liner may be either tetraethylorthosilicate (TEOS) or silicon nitride, although any other applicable dielectric material may alternatively be used. The liner may be formed using a plasma enhanced chemical vapor deposition (PECVD) process, although another applicable process, such as physical vapor deposition or a thermal process, may alternatively be used. The barrier layer (not shown) may be formed over the liner (if present) and may cover the sidewalls and bottom of the trench 122 and the trench 124. The barrier layer may be formed using a process such as CVD, PVD, PECVD, plasma enhanced physical vapor deposition (PEPVD), ALD, or any other applicable deposition process. The barrier layer may be made of tantalum nitride, although other materials, such as tantalum, titanium, titanium nitride, or the like, may also be used.

The method described above forms two conductive lines 162 and 164 for illustration, but the present disclosure does not limit the method to such. For example, the method can form three or more conductive lines arranged end-to-end. An example process using the method to form three conductive lines arranged end-to-end is described as follows.

Figures 1, 2A:
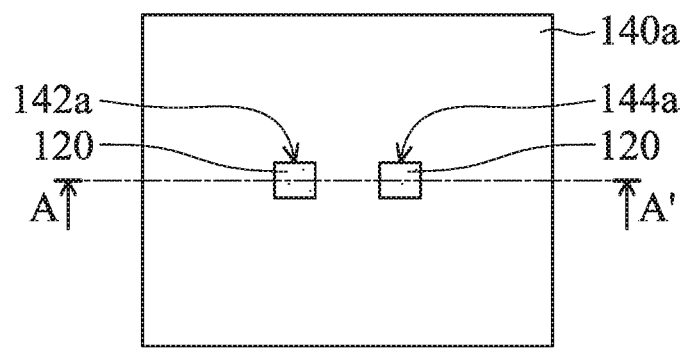
Figures 2, 2A:
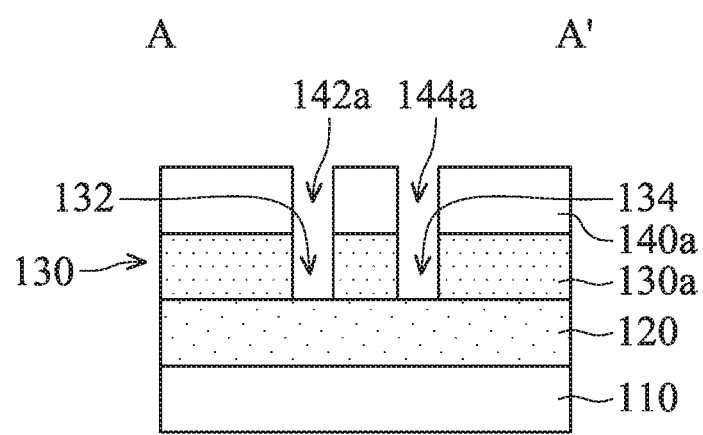
Figures 1, 2B:
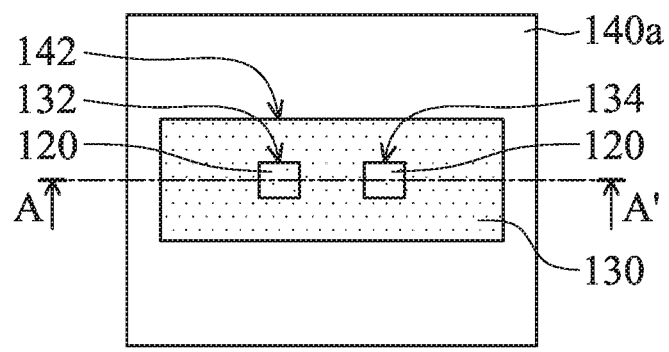
Figures 2, 2B:
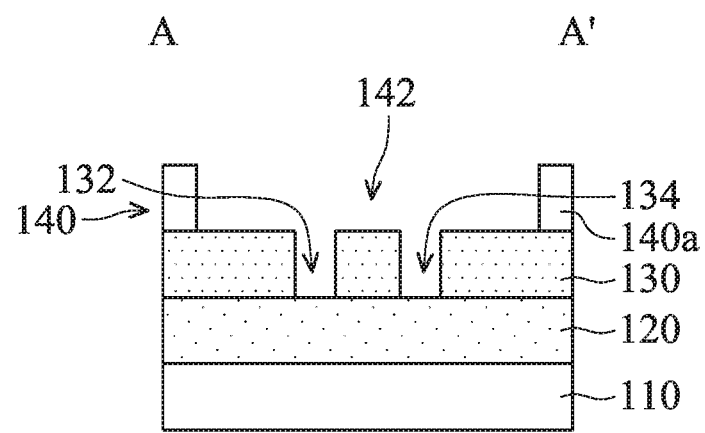
Figures 1, 2C:
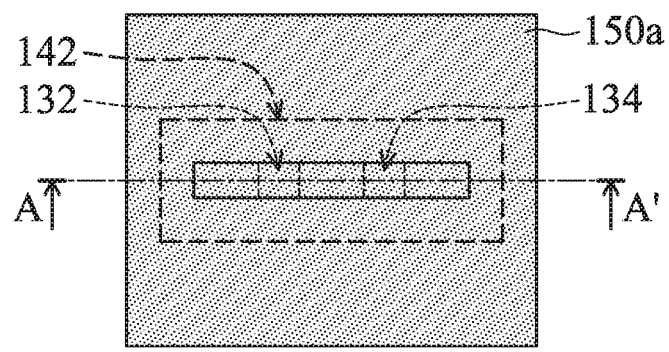
Figures 2, 2C:
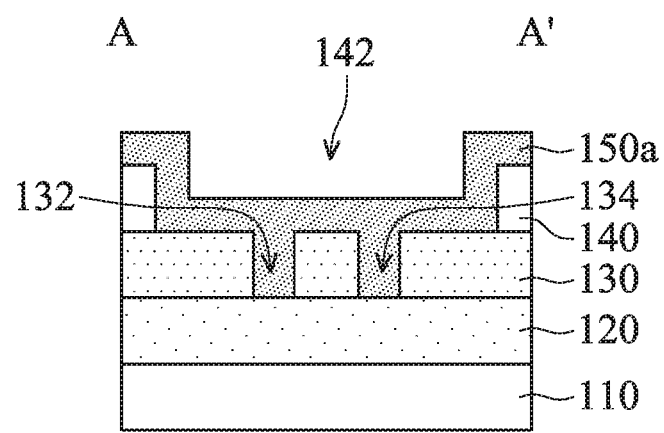
Figures 1, 2D:
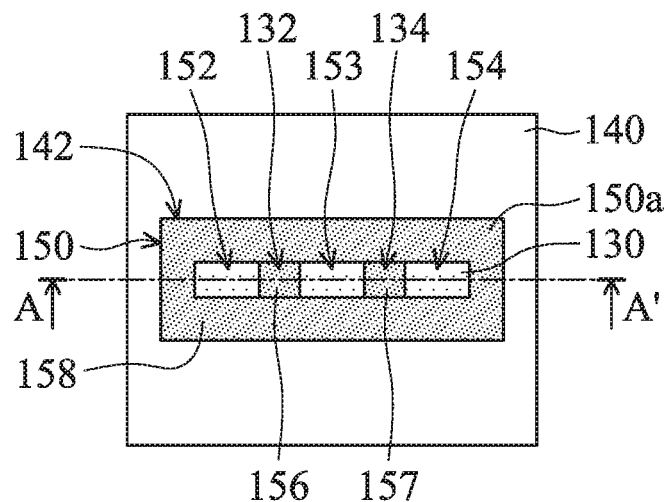
Figures 2, 2D:
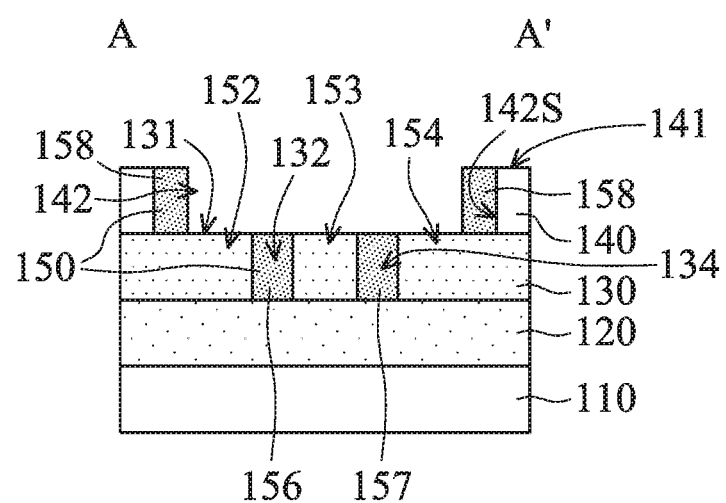
Figures 1, 2E:
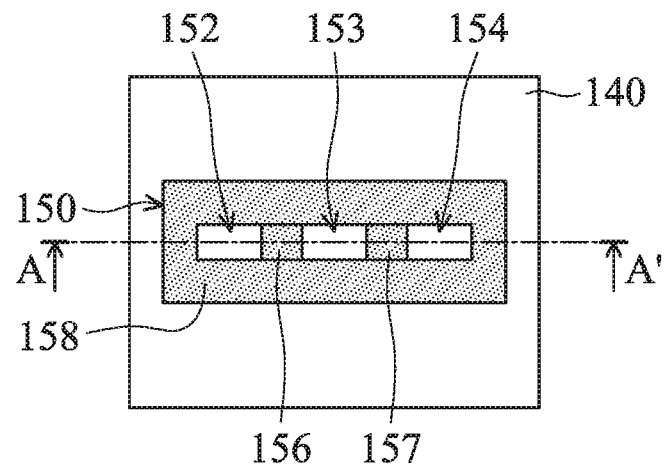
Figures 2, 2E:
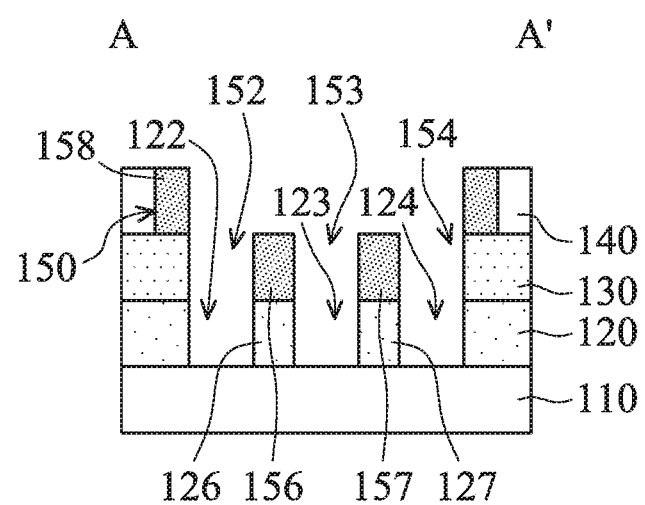
Figures 1, 2F:
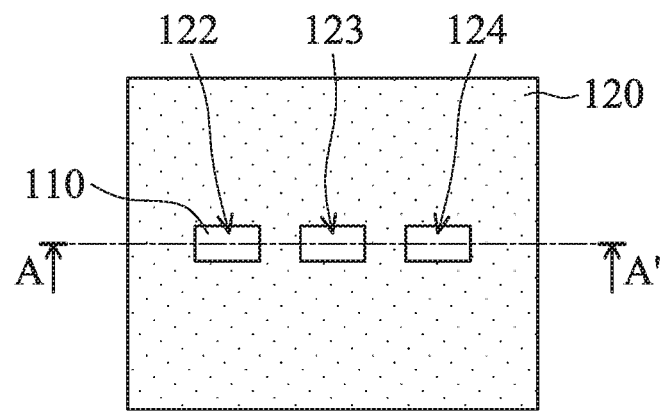
Figures 2, 2F:
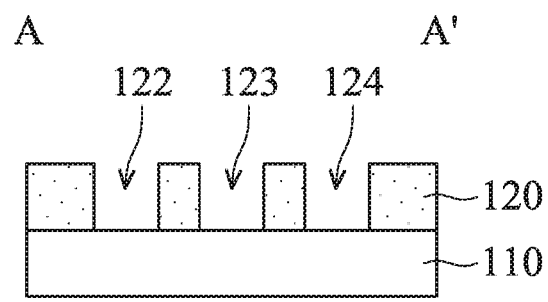
Figures 1, 2G:
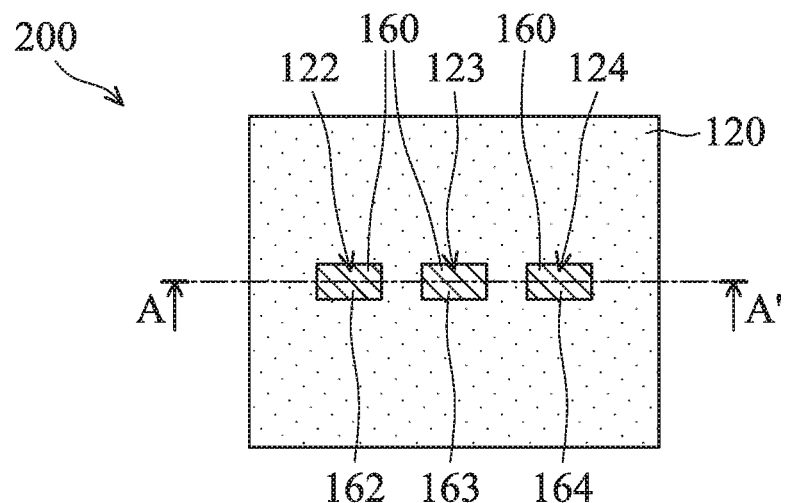
Figures 2, 2G:
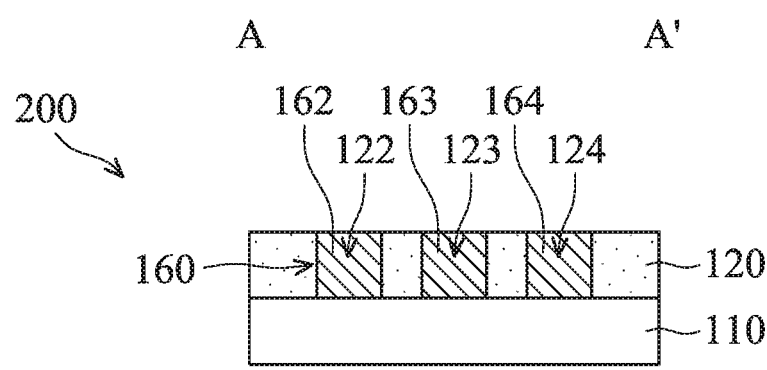

FIGS. 2A-1 to 2G-1 are top views of various stages of a process for forming a semiconductor device structure 200, according to various aspects of the present disclosure. FIG. 2A-2 to 2G-2 are cross-sectional views of various stages of a process for forming the semiconductor device structure 200 along lines A-A' shown in FIGS. 2A-1 to 2G-1, according to various aspects of the present disclosure. Additional features can be added in the semiconductor device structure 200, and some of the features described below can be replaced, modified, or eliminated in other embodiments of the semiconductor device structure 200.

After the stage of fabrication depicted in FIGS. 1A-1, 1A-2, and 1A-3, in FIG. 2A-1 and FIG. 2A-2, a portion of the first hard mask material layer 130a and the second hard mask material layer 140a is removed, in accordance with some embodiments. Therefore, the opening 132 and the opening 134 are formed in the first hard mask material layer 130a, and the opening 142a and the opening 144a are formed in the second hard mask material layer 140a, in accordance with some embodiments. The opening 132 is connected to the opening 142a, and the opening 134 is connected to the opening 144a so as to expose a portion of the dielectric layer 120, in accordance with some embodiments.

In FIG. 2B-1 and FIG. 2B-2, a portion of the second hard mask material layer 140a is removed to form the trench 142 in the second hard mask material layer 140a, in accordance with some embodiments. The trench 142 connects the openings 132 and 134, in accordance with some embodiments. The second hard mask material layer 140a with the trench 142 forms a second hard mask layer 140, in accordance with some embodiments.

In FIG. 2C-1 and FIG. 2C-2, a filling material layer 150a is formed over the first hard mask layer 130, the second hard mask layer 140, and the dielectric layer 120 exposed by the openings 132 and 134, in accordance with some embodiments. The filling material layer 150a fills the openings 132 and 134, in accordance with some embodiments.

In FIG. 2D-1 and FIG. 2D-2, a portion of the filling material layer 150a is removed to form openings 152, 153, and 154 exposing the first hard mask layer 130, in accordance with some embodiments. The opening 152 and the opening 153 are positioned at two opposite sides of the opening 132, respectively, in accordance with some embodiments. The opening 153 and the opening 154 are positioned at two opposite sides of the opening 134, respectively, in accordance with some embodiments. In some embodiments, the removal of the portion of the filling material layer 150a includes removing a portion of the filling material layer 150a over the top surface 131 of the first hard mask layer 130. In some embodiments, the removal of the portion of the filling material layer 150a further includes removing the filling material layer 150a over the top surface 141 of the second hard mask layer 140. In some embodiments, the removal of the portion of the filling material layer 150a further includes removing the filling material layer 150a over the openings 132 and 134.

The filling material layer 150a within the openings 152, 153, and 154 forms a filling layer 150, in accordance with some embodiments. The filling layer 150 has the first portion 156 and the second portion 158, in accordance with some embodiments. The filling layer 150 also has a first portion 157, in accordance with some embodiments. The first portions 156 and 157 fill in the openings 132 and 134, respectively, in accordance with some embodiments. The second portion 158 is positioned over the inner walls 142s of the trench 142, in accordance with some embodiments. The openings 152 and 153 are separated from each other by the first portion 156, in accordance with some embodiments. The openings 153 and 154 are separated from each other by the first portion 157, in accordance with some embodiments. In some embodiments, the first portions 156 and 157 are connected to the second portion 158.

In FIG. 2E-1 and FIG. 2E-2, the first hard mask layer 130 and the dielectric layer 120 are removed through the openings 152, 153, and 154 to form trenches 122, 123, and 124 in the dielectric layer 120, in accordance with some embodiments. The trench 122 is positioned under the opening 152, in accordance with some embodiments. The trench 123 is positioned under the opening 153, in accordance with some embodiments. The trench 124 is positioned under the opening 154, in accordance with some embodiments. After the removal process, portions 126 and 127 of the dielectric layer 120 under the first portions 156 and 157 of the filling layer 150 remain, in accordance with some embodiments. The portion 126 separates the trench 122 from the trench 123, in accordance with some embodiments. The portion 127 separates the trench 123 from the trench 124, in accordance with some embodiments.

In FIG. 2F-1 and FIG. 2F-2, the first hard mask layer 130, the second hard mask layer 140, and the filling layer 150 are removed, in accordance with some embodiments. In FIG. 2G-1 and FIG. 2G-2, a conductive layer 160 is formed in the trenches 122, 123, and 124 of the dielectric layer 120, in accordance with some embodiments. The conductive layer 160 positioned in the trench 122 forms a conductive line 162, in accordance with some embodiments. The conductive layer 160 positioned in the trench 123 forms a conductive line 163, in accordance with some embodiments. The conductive layer 160 positioned in the trench 124 forms a conductive line 164, in accordance with some embodiments. The conductive lines 162, 163, and 164 have substantially the same line width, in accordance with some embodiments. The conductive lines 162, 163, and 164 are arranged end-to-end and spaced apart from each other, in accordance with some embodiments. In some embodiments, the conductive lines 162, 163, and 164 are arranged in a straight line.

Various methods for forming semiconductor device structures (such as conductive lines) are disclosed herein. The methods use a first hard mask layer with an opening, a second hard mask layer with a trench, and a filling layer filled in the opening as an etching mask to form trenches in a dielectric layer. The trenches are used to form conductive lines. The filling layer filled in the opening enables a portion of the dielectric layer to remain and separate the conductive lines from each other, which prevents the conductive lines from being short-circuited with each other. The methods may form the conductive lines arranged end-to-end and spaced apart from each other. The end-to-end arrangement may improve the arrangement density of the conductive lines and routing flexibility.

In accordance with some embodiments, a method for forming a semiconductor device structure is provided. The method includes forming a dielectric layer over a substrate, and forming a first hard mask layer and a second hard mask layer over the dielectric layer. The second hard mask layer can be positioned over the first hard mask layer. The first hard mask layer has a first opening that exposes the dielectric layer, and the second hard mask layer has a first trench connected to the first opening. The method further includes forming a filling layer in the first opening and over inner walls of the first trench. The filling layer has a second opening and a third opening positioned at two opposite sides of the first opening, respectively. The method further includes removing the first hard mask layer and the dielectric layer through the second opening and the third opening to form a second trench and a third trench in the dielectric layer. The method further includes removing the first hard mask layer, the second hard mask layer, and the filling layer. The method further includes forming a conductive layer in the second trench and the third trench.

In accordance with some embodiments, a method for forming a semiconductor device structure is provided. The method includes forming a dielectric layer over a substrate and forming a first hard mask layer and a second hard mask layer over the dielectric layer. The second hard mask layer is positioned over the first hard mask layer. The first hard mask layer has a first opening exposing the dielectric layer, and the second hard mask layer has a first trench connected to the first opening. The method further includes forming a filling layer over the first hard mask layer and the second hard mask layer. The filling layer has a first portion filled in the first opening and a second portion over inner walls of the first trench. The filling layer has a second opening and a third opening separated from each other by the first portion. The method further includes removing the first hard mask layer and the dielectric layer through the second opening and the third opening to form a second trench and a third trench in the dielectric layer. The method further includes removing the first hard mask layer, the second hard mask layer, and the filling layer. The method further includes forming a conductive layer in the second trench and the third trench to form a first conductive line and a second conductive line.

In accordance with some embodiments, a method for forming a semiconductor device structure is provided. The method includes forming a dielectric layer over a substrate and forming a first hard mask layer and a second hard mask layer over the dielectric layer. The second hard mask layer is positioned over the first hard mask layer. The first hard mask layer has a first opening exposing the dielectric layer. The second hard mask layer has a first trench connected to the first opening. The method further includes depositing a filling material layer over the first hard mask layer, the second hard mask layer, and the dielectric layer exposed by the first opening. The method further includes performing an anisotropic etching process to remove the filling material layer over top surfaces of the first hard mask layer and the second hard mask layer so as to form a second opening and a third opening in the filling material layer. The second opening and the third opening are positioned at two sides of the first opening, respectively, and the filling material layer within the second opening and the third opening forms a filling layer. The method further includes removing the first hard mask layer and the dielectric layer through the second opening and the third opening to form a second trench and a third trench in the dielectric layer. The method further includes removing the first hard mask layer, the second hard mask layer, and the filling layer. The method further includes forming a conductive layer in the second trench and the third trench to form a first conductive line and a second conductive line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    depositing a first dielectric layer over a substrate;
    depositing a second dielectric layer over the first dielectric layer;
    depositing a third dielectric layer over the second dielectric layer;
    performing a first etching process to form a first opening in the third dielectric layer and the second dielectric layer, wherein the first opening exposes the first dielectric layer;
    performing a second etching process to expand the first opening into a second opening in the third dielectric layer, wherein the second opening exposes the second dielectric layer;
    depositing a fourth dielectric layer that fills the first opening in the second dielectric layer and partially fills the second opening in the third dielectric layer, wherein an third opening in the fourth dielectric layer exposes a first portion of the second dielectric layer and a second portion of the second dielectric layer, wherein the fourth dielectric layer separates the first portion of the second dielectric layer from the second portion of the second dielectric layer;
    performing a third etching process that removes the first portion of the second dielectric layer, the second portion of the second dielectric layer, a first portion of the first dielectric layer underlying the first portion of the second dielectric layer, and a second portion of the first dielectric layer underlying the second portion of the second dielectric layer, thereby defining a fourth opening and a fifth opening in the first dielectric layer;

performing a fourth etching process to remove the fourth dielectric layer, the third dielectric layer, and the second dielectric layer; and depositing a metal layer in the fourth opening and the fifth opening in the first dielectric layer, thereby forming a first metal line and a second metal line.

2. The method of claim 1, wherein the first dielectric layer, the second dielectric layer, the third dielectric layer, and the fourth dielectric layer include materials configured to achieve etching selectivity during the first etching process, the second etching process, and the third etching process.

3. The method of claim 1, further comprising performing a fifth etching process that removes the fourth dielectric layer from over a top surface of the third dielectric layer and a top surface of the second dielectric layer to define the third opening.

4. The method of claim 1, wherein a width of the first opening defines an end-to-end spacing between the first metal line and the second metal line.

5. The method of claim 1, wherein a width of the first metal line and a width of the second metal line is defined by a difference between a width of the second opening and two times a thickness of the fourth dielectric layer.

6. The method of claim 1, wherein a width of the second opening is greater than two times a thickness of the fourth dielectric layer.

7. The method of claim 1, wherein the first etching process, the second etching process, the third etching process, and the fourth etching process includes performing a dry etching process.

8. The method of claim 1, wherein the performing the first etching process and the performing the second etching process includes using a patterned resist layer.

\* \* \* \* \*